United States Patent [19]

Cornett

[11] Patent Number: 4,745,394
[45] Date of Patent: May 17, 1988

[54] PIPELINED A/D CONVERTER

[75] Inventor: Frank N. Cornett, Queen Creek, Ariz.

[73] Assignee: Motorola, Inc., Schaumburg, Ill.

[21] Appl. No.: 33,717

[22] Filed: Apr. 3, 1987

[51] Int. Cl.[4] .............................................. H03M 1/44
[52] U.S. Cl. ............................................... 340/347 AD
[58] Field of Search ................................. 340/347 AD

[56] References Cited

U.S. PATENT DOCUMENTS

| | | | |
|---|---|---|---|
| 3,599,204 | 8/1971 | Severin | 340/347 AD |
| 4,393,368 | 7/1983 | Rasmussen | 340/347 AD |
| 4,596,978 | 6/1986 | Fujita | 340/347 AD |
| 4,611,196 | 9/1986 | Fernandez | 340/347 AD |

Primary Examiner—William M. Shoop, Jr.
Assistant Examiner—Richard K. Blum
Attorney, Agent, or Firm—Maurice J. Jones

[57] ABSTRACT

An A/D converter which utilizes a plurality of series connected stages is disclosed. Each stage produces a single digital output bit. Errors are dynamically compensated utilizing alignment cycles. Error correction circuitry statistically analyzes an alignment signal during an alignment cycle. Various feedback paths form within each stage during an alignment cycle, and error compensation signals achieve optimum values which compensate for errors within each stage.

19 Claims, 2 Drawing Sheets

PIPELINED A/D CONVERTER

BACKGROUND OF THE INVENTION

This invention relates generally to analog-to-digital (A/D) converters. Specifically, the present invention relates to A/D converters which are suitable for high speed operation. More specifically, the present invention relates to A/D converters having an architecture which lends itself to expansion to achieve a greater precision digital output.

Prior art devices confront problems of converting an analog signal into a digital representation of the analog signal. One high speed approach is the "Flash" or parallel comparison type A/D converter. In a parallel comparison type A/D converter an input analog signal is compared with a multiplicity of reference voltages by a multiplicity of analog comparators. Digital outputs from the multiplicity of analog comparators are encoded into an acceptable digital output code. The parallel comparison A/D converter establishes the multiplicity of reference voltages through the use of a multiplicity of series connected resistors which are coupled between maximum reference voltages.

Such parallel comparison type A/D converters have several drawbacks. For example, each of the multiplicity of series connected resistors requires a relatively large area when these resistors are implemented in an integrated circuit. Furthermore, these resistors must exhibit extremely precise values and are typically laser trimmed. A relatively high cost device results.

Additionally, the parallel comparison type A/D converters do not readily expand to achieve a greater precision digital output. Each added bit of output precision increases circuit complexity by a factor of 2. Furthermore, the large number of comparators which the analog input signal feeds causes loading problems which are typically cured in a manner that slows overall conversion time.

SUMMARY OF THE INVENTION

Accordingly, it is an object of the present invention to provide an improved A/D converter which is suitable for high speed operation.

Another object of the present invention concerns providing an A/D converter which is readily expandable to increase precision of the digital output.

Yet another object of the present invention concerns providing an A/D converter which is suitable for implementation in an integrated circuit, or in a plurality of identical interconnected integrated circuits, without the use of a large number of external components.

Still another object of the present invention concerns achieving precise digital output results without relying upon extremely precise components within the A/D converter or upon special trimming operations.

The above and other objects and advantages of the present invention are carried out in one form by an analog to digital converter which includes an amplifier and a comparator. An input of the amplifier and an input of the comparator couple together and are adapted to receive a stage input signal. Thus, the amplifier provides an amplifier output signal and the comparator provides a digital output bit. Additionally, the A/D digital converter includes circuitry for combining a maximum voltage reference signal with the amplifier output signal. This combining circuit operates under the control of the digital output bit.

BRIEF DESCRIPTION OF THE DRAWINGS

A more complete understanding of the present invention may be derived by reference to the detailed description and claims when considered in connection with the accompanying drawings, wherein like reference numbers indicate similar features, and wherein:

DETAILED DESCRIPTION OF THE PREFERRED EMBODIMENT

Figure 1:
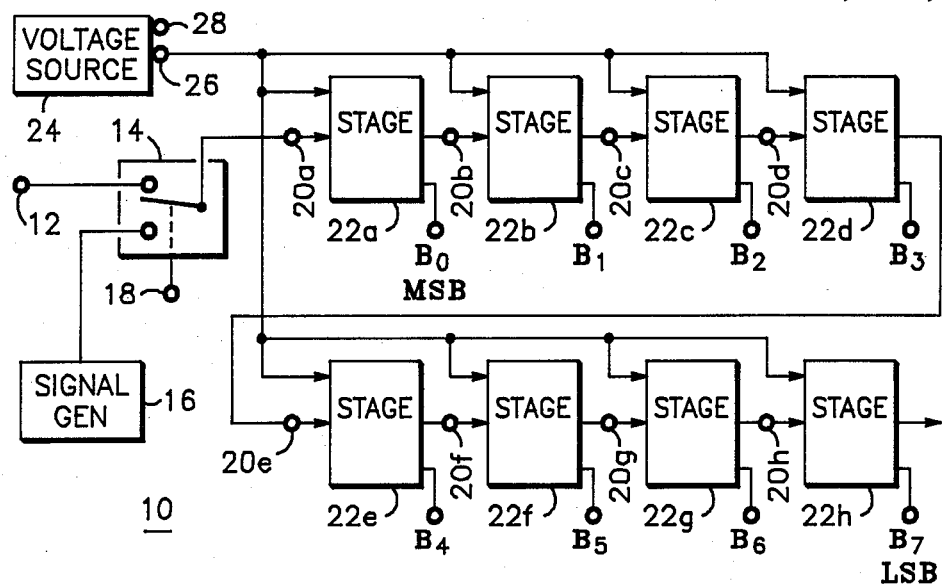
FIG. 1 shows a high level block diagram of an A/D converter built according to the teachings of the present invention.

FIG. 1 shows a block diagram of a pipelined analog-to-digital (A/D) converter. An A/D converter inputs a single analog signal and outputs a plurality of digital signals. The digital output signals, or bits, collectively provide a digital representation of the analog signal. In FIG. 1 a terminal 12 receives the input analog signal which is to be converted by A/D converter 10. Terminal 12 connects to a first node of a switch 14. A signal generator 16 has an output which connects to a second node of switch 14. A third node of switch 14 represents an output to which signals on either the first or second nodes of switch 14 are routed depending upon the state of an alignment cycle control signal applied at a terminal 18. Terminal 18 connects to a control input of switch 14. Signal generator 16 provides an alignment signal, and switch 14 selectively routes either the alignment signal or the analog input signal presented at terminal 12 to the third node of switch 14. The third node of switch 14 connects to a terminal 20a and a signal input of a stage 22a of A/D converter 10.

FIG. 1 shows an embodiment of A/D converter 10 which has 8 stages. The 8 stages are connected in a series manner. Hence, the present invention is called a pipelined A/D converter. An analog output of stage 22a connects to a terminal 20b and a signal input of a stage 22b. Likewise, an analog output of stage 22b connects to a terminal 20c and a signal input of a stage 22c. An analog output of stage 22c connects to a terminal 20d and to a signal input of a stage 22d. An analog output of stage 22d connects to a terminal 20e and to a signal input of a stage 22e. An analog output of stage 22e connects to a terminal 20f and to a signal input of a stage 22f. An analog output of stage 22f connects to a terminal 20g and to a signal input of a stage 22g. An analog output of stage 22g connects to a terminal 20h and to a signal input of a stage 22h. An analog output of stage 22h may connect to additional stages (not shown) or it may remain unconnected.

Each of stages 22a through 22h has a single digital output, designated $B_0$, $B_1$, $B_2$, $B_3$, $B_4$, $B_5$, $B_6$, and $B_7$, respectively. $B_0$, represents the most significant bit (MSB) output from A/D converter 10, and $B_7$, represents the least significant bit (LSB) output from A/D converter 10. Accordingly, the embodiment of A/D converter 10 shown in FIG. 1 converts the analog signal input at terminal 12 into an 8 bit digital representation of the analog signal. This digital representation will be encoded in an offset binary code which is known to those skilled in the art.

A voltage source 24 provides a plurality of DC voltage outputs. Some of the voltage outputs are provided at outputs 28. These are discussed in more detail below, in connection with FIG. 3. A maximum voltage reference signal is provided at output 26 of voltage source 24. In the present invention, the voltage levels provided by voltage source 24 need not exhibit a precise value. Output 26 of voltage source 24 connects to a maximum voltage reference signal input in each of stages 22a through 22h.

Output 26 supplies a maximum voltage reference signal which exhibits a voltage equal to one-half of the voltage range permitted for an input analog signal at terminal 12 of A/D 10. When A/D 10 is configured to accommodate bipolar input analog signals, this maximum voltage reference signal exhibits a value equivalent to the maximum positive voltage permitted for input analog signals by A/D 10. Input analog signals exhibiting voltages beyond the range permitted for input analog signals are converted into maximum output digital values by A/D 10 regardless of the actual input analog signals' value.

Figure 2:
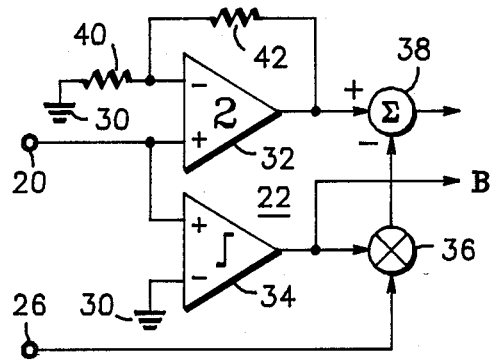
FIG. 2 shows a block diagram of a single stage of the A/D converter shown in FIG. 1.

FIG. 2 shows one embodiment of any one of stages 22 from FIG. 1. In FIG. 2 terminal 20 provides a stage input signal to a signal input of an amplifier 32 and a first input of an analog comparator 34. Amplifier 32 operates in a non-inverting mode in the preferred embodiment. Thus, terminal 20 couples to a non-inverting input of amplifier 32. Additionally, amplifier 32 is configured to have a gain of approximately 2. Thus, as shown in FIG. 2 a resistor 40 may advantageously be coupled between the inverting input of amplififer 32 and a terminal 30, which is adapted to receive a common potential or ground. Furthermore, a resistor 42 may advantageously be coupled between the inverting input of amplififer 32 and an output of amplifier 32. Additionally, resistors 40 and 42 may advantageously exhibit equal resistance values. Although FIG. 2 shows a particular amplifier configuration, those skilled in the art will recognize that many amplifier configurations are suitable for the present invention.

In the preferred embodiment terminal 20 connects to a non-inverting input of analog comparator 34. An inverting input of analog comparator 34 connects to terminal 30. Thus, terminal 30 provides a predetermined reference level, which in the preferred embodiment is ground, against which the stage input signal is compared. This predetermined reference level exhibits a value centrally located in the voltage range permitted for input signals by A/D 10 (see FIG. 1). Thus, the ground predetermined reference level configures A/D 10 to accommodate a bipolar input analog signal voltage range.

Comparator 34 has an output which provides the digital output bit from stage 22. The digital output bit in the preferred embodiment exhibits one of two logical states which are defined as either a minus 1 or a plus 1 in the preferred embodiment. Output terminal 26, from voltage source 24 (see FIG. 1) couples to a first input of a multiplier 36. The output of comparator 34 couples to a second input of multiplier 36. Multiplier 36 has an output which connects to a minus input of an adder 38, and the output of amplifier 32 couples to a plus input of adder 38. An output from adder 38 represents the stage output signal from stage 22.

Since the digital output bit exhibits only one of two logical states, multiplier 36 multiplies the maximum voltage reference signal provided at terminal 26 by either a plus 1 or a minus 1. Accordingly, multiplier 36 performs a selective inversion of the maximum voltage reference signal. The selective inversion occurs under the control of a digital output bit. Together multiplier 36 and adder 38 operate to combine the maximum voltage reference signal with an amplified output signal which is provided by amplifier 32. This combining occurs in a manner defined by the digital output bit from comparator 34.

When the stage input signal is greater than 0 volts to the preferred embodiment shown in FIG. 2, comparator 34 provides a plus 1 output. Thus, the output from multiplier 36 equals the maximum voltage reference signal. The amplifier output signal exhibits twice the level of the stage input signal due to the operation of amplifier 32. Accordingly, the output from adder 38 in this example equals twice the stage input signal minus the maximum voltage reference signal.

On the other hand, if the stage input signal is less than 0 volts, the digital output bit from comparator 34 is a minus 1, and the output signal from multiplier 36 is the negative of the maximum voltage reference signal. The amplifier output signal is a negative voltage signal of twice the magnitude of the stage input signal. Accordingly, a negative signal is provided at the plus input of adder 38 and a negative magnitude signal is provided at the minus input of adder 38. As a result, in this example the output from adder 38 is a signal which is less negative, or more positive, than the amplifier output signal.

Those skilled in the art will recognize that a wide variety of circuits may be utilized to achieve the purposes of multiplier 36 and adder 38. For example, multiplier 36 could be replaced by a switching or multiplexing circuit which selects either a positive or negative maximum voltage reference signal depending upon the logical state of the digital output bit. Furthermore, the polarities for each of amplifier 32, comparator 34, and the inputs of adder 38 are subject to manipulation while still accomplishing the task of the circuit shown in FIG. 2.

Each of stages 22a through 22h (see FIG. 1) may advantageously contain a circuit such as that shown in FIG. 2. Since these circuits are connected in series, errors which may originate in more significant bit stages will accumulate as errors from lesser significant bit stages add thereto. As a result, relatively significant errors may occur in the lesser significant bit stages of A/D converter 10.

Such errors may be classified into two categories. One category is a gain error which results when the gain in amplifier 32 for any of stages 22 does not precisely equal 2. Accordingly, any difference in the actual gain of amplifier 32 from a gain of 2 represents a gain error.

Another category of error is offset error. Offset errors may be produced when comparator 34 does not switch at precisely the predetermined reference voltage level, such as the ground shown in FIG. 2. Additionally, an offset error may occur if adder 38 produces an output signal that does not precisely equal the subtraction of input signals. Still further, other devices (not shown) in series with the signal path may produce further offset errors.

Accordingly, the preferred embodiment of the present invention provides circuitry which compensates for these errors. This compensation operates to change values of signals discussed above from their otherwise nominal values so that the resulting stage outputs, such as the digital output bit and the stage output signal, reflect the values which would occur without the introduction of gain or offset errors.

Figure 3:
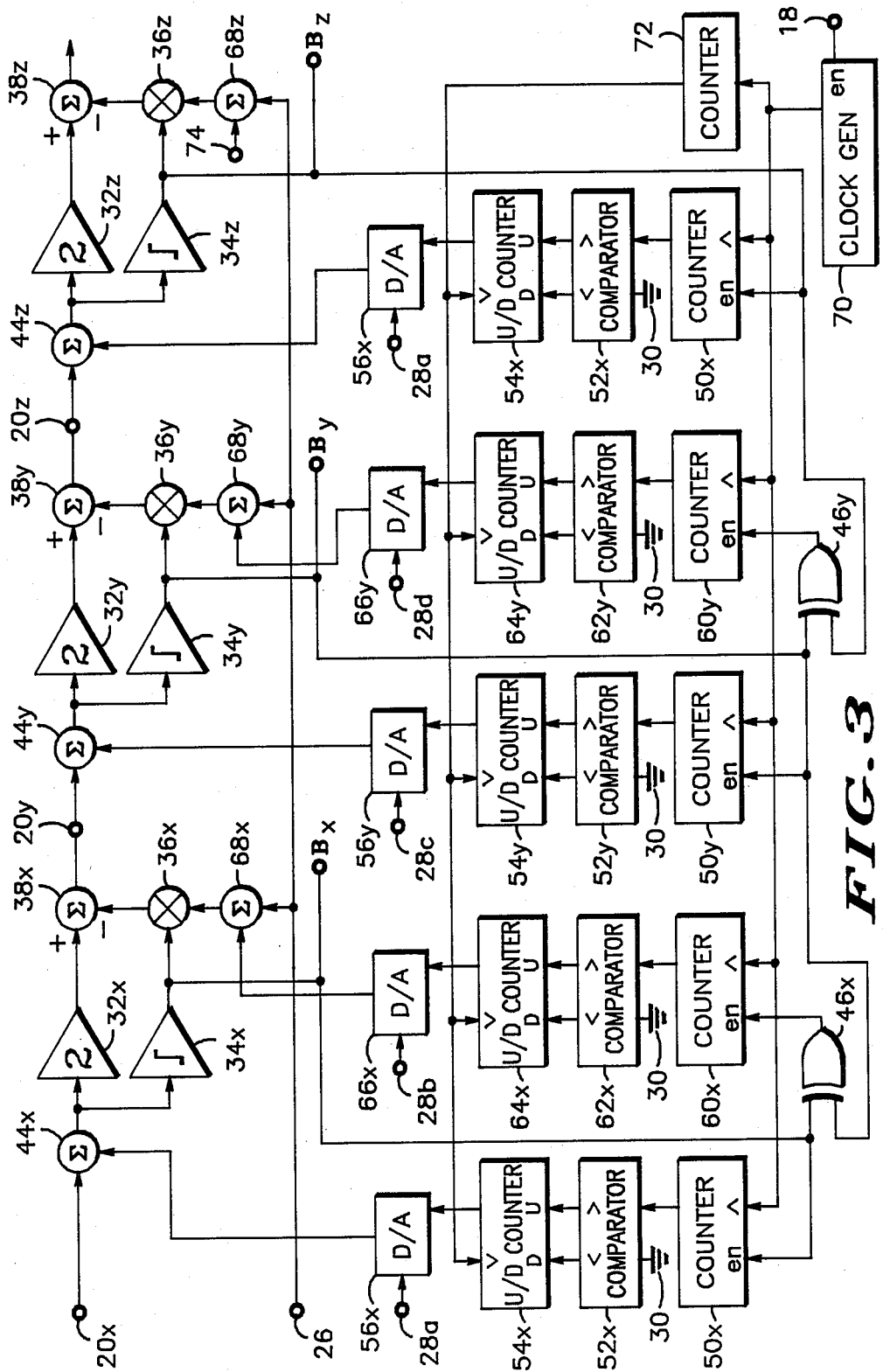
FIG. 3 shows a block diagram of three stages of the A/D converter including circuitry for error compensation.

Referring to FIG. 3, three adjoining stages 22 are shown with circuitry that compensates for such errors. These stages 22 may represent any three stages of A/D converter 10 (see FIG. 1). Accordingly, these three stages are designated 22x, 22y, and 22z in FIG. 3.

In FIG. 3, terminal 20x couples to a first input of an adder 44x, and an output of adder 44x couples to an input of an amplifier 32x and to an input of a comparator 34x. An output of comparator 34x couples to a second input of a multiplier 36x, and an output of amplifier 32x couples to a plus input of an adder 38x. An output of multiplier 36x couples to a minus input of adder 38x. An output of adder 38x couples to a terminal 20y and to a first input of an adder 44y. An output of adder 44y couples to an input of an amplifier 32y and to an input of a comparator 34y. An output of comparator 34y couples to a second input of a multiplier 36y, and an output of amplifier 32y couples to a plus input of an adder 38y. An output of multiplier 36y couples to a minus input of adder 38y. An output of adder 38y couples to a terminal 20z and to a first input of an adder 44z. An output of adder 44z couples to an input of an amplifier 32z and to an input of a comparator 34z. An output of comparator 34z couples to a second input of a multiplier 36z, and an output of amplifier 32z couples to a plus input of an adder 38z. An output of multiplier 36z couples to a minus input of adder 38z. An output of adder 38z may advantageously couple to additional stages of A/D converter 10 (see FIG. 1) or may remain unconnected.

Thus, amplifiers 32, comparators 34, multipliers 36, and adders 38 couple together substantially as described above in connection with FIG. 2. In addition, adders 44 couple between terminals 20, which provide stage input signals, and to inputs to amplifiers 32 and comparators 34. Amplifiers 32, comparators 34, multipliers 36, and adders 38 operate substantially as described above in connection with FIG. 2.

The error correction capabilities of the embodiment shown in the FIG. 3 block diagram result from the operation of adders 44 and of adders 68. Accordingly, an output of an adder 68x couples to a first input of multiplier 36x, an output of an adder 68y couples to a first input of multiplier 36y, and an output of an adder 68z couples to a first input of multiplier 36z.

The output from comparator 34x provides digital output bit $B_x$ and couples to a first input of an Exclusive OR gate 46x and an enable input of an offset duty cycle counter 50x. An output of Exclusive OR gate 46x couples to an enable input of a gain occurrence counter 60x. A count output of offset duty cycle counter 50x couples to the first input of an offset digital comparator 52x, and a second input of offset digital comparator 52x couples to a predetermined reference level, such as ground 30 or a logic 0. A greater-than output of comparator 52x couples to an up input of up/down counter 54x, and a less-than output of comparator 52x couples to a down input of up/down counter 54x. A count output of counter 54x couples to a digital input of digital-to-analog (D/A) converter 56x, and a first reference voltage signal is applied at a terminal 28a from voltage source 24 (see FIG. 1). Terminal 28a couples to a reference signal input of D/A 56x. An analog output of D/A 56x couples to a second input of adder 44x.

A count output of gain occurrence counter 60x couples to a first input of a digital gain comparator 62x, and a second input of digital gain comparator 62x couples to a predetermined reference level, such as ground or a logical 0. A greater-than output of comparator 62x couples to an up input of an up/down counter 64x, and a less-than output of comparator 62x couples to a down input of up/down counter 64x. A count output of counter 64x couples to a digital input of D/A converter 66x, and a second reference voltage signal is applied at a terminal 28b, which couples to a reference signal input of D/A converter 66x. An output of D/A converter 66x couples to a first input of adder 68x. And, the maximum voltage reference signal from terminal 26 is applied at a second input of adder 68x.

For stage 22y, the digital output bit from comparator 34y provides digital output bit $B_y$ and couples to a second input of Exclusive OR gate 46x, a first input of an Exclusive OR gate 46y, and an enable input of an offset duty cycle counter 50y. An output of offset duty cycle counter 50y couples to a first input of a digital offset comparator 52y, and a second input of comparator 52y couples to a predetermined reference level, such as logical 0. A greater-than output from comparator 52y couples to an up input of an up/down counter 54y, and a less-than output of comparator 52y couples to a down input of up/down counter 54y. A count output of counter 54y couples to a digital input of a D/A converter 56y, and a third predetermined voltage reference level is applied at a terminal 28c, which couples to a reference signal input of a D/A converter 56y. An analog output of D/A converter 56y couples to a second input of adder 44y.

An output of Exclusive OR gate 46y couples to an enable input of a gain occurrence counter 60y, and a count output of gain occurrence counter 60y couples to a first input of a digital gain comparator 62y. A second input of digital gain comparator 62y couples to a predetermined reference signal, such as a logical 0. A greater-than output of comparator 62y couples to an up input of up/down counter 64y, and a less than output of comparator 62y couples to a down input of up/down counter 64y. A count output of up/down counter 64y couples to a digital input of a D/A converter 66y. A fourth voltage reference signal couples to a terminal 28d, which couples to a reference signal input of D/A converter 66y. An analog output of D/A converter 66y couples to a first input of adder 68y, and a second input of adder 68y couples to terminal 26, which provides the maximum voltage reference signal.

For stage 22z, the output of comparator 34z provides digital output bit $B_z$, couples to a second input of Exclusive OR gate 46y, and an enable input of an offset duty cycle counter 50z. A count output from counter 50z couples to a first input of a digital offset comparator 52z, and a second input of digital offset comparator 52z couples to a predetermined reference level, such as a logical 0. A greater-than output of comparator 52z couples to an up input of an up/down counter 54z, and a less-than output of comparator 52z couples to a down input of up/down counter 54z. A count output of counter 54z couples to a digital input of a D/A converter 56z. A fifth reference voltage is applied to a terminal 28e, which couples to a reference signal input of D/A converter 56z. An analog output of D/A converter 56z couples to a second input of adder 44z.

Terminal 26, which supplies the maximum voltage reference signal, couples to a first input of adder 68z, and a terminal 74 couples to a second input of adder 68z. Terminal 74 may advantageously couple to an analog output of a D/A converter (not shown), or may connect to ground if stage 22z represents the least significant stage of A/D converter 10 (see FIG. 1).

An alignment cycle control signal is applied to a terminal 18. Terminal 18 couples to an enable input of a clock generator 70. A clock generator 70 provides a sample clock signal at an output thereof when enabled by the alignment cycle control signal. The output of clock generator 70 couples to clock inputs of counters 50x, 60x, 50y, 60y, 50z, and a sample-set counter 72. An output of sample set counter 72 couples to clock inputs of up/down counters 54x, 64x, 54y, 64y, and 54z.

The present invention compensates for offset and gain errors through the use of the alignment signal discussed above in connection with FIG. 1. The alignment signal may represent any one of a number of signals which have predetermined characteristics, including white noise. However, the preferred embodiment utilizes a sine wave for the alignment signal. In order to compensate for errors, A/D converter 10 (see FIG. 1) initiates an alignment cycle which occupies a relatively small portion of the time over which A/D converter 10 operates. A/D converter 10 may enter alignment cycles immediately after power is applied, at regular, infrequent intervals, whenever a system which utilizes A/D converter 10 has no current use of A/D converter 10, or when certain environmental conditions, such as temperature, change. The frequency of the sine wave alignment signal utilized in the preferred embodiment is not critical to the present invention. However, this frequency should not represent either a harmonic or a subharmonic of the sample clock signal which is generated by clock generator 70. Additionally, the amplitude of the alignment signal is not critical to the present invention, but preferably exhibits peak values which approximate the maximum voltage reference signal.

The sample clock signal generated by clock generator 70 defines the sample rate for the alignment cycle of A/D converter 10 (see FIG. 1). This sample rate is not critical. However, it may advantageously be as fast as possible to minimize alignment time. Sample-set counter 72 outputs a clock signal once for each set of samples. In the preferred embodiment, a set of samples equals 1,024 samples. However, this number of samples is not a critical value. Accordingly, counters 50 and 60 are clocked at each sample, and up/down counters 54 and 64 are clocked once during each sample set. Counters 50 and 60 increment if enabled by the signals input at the enable inputs of counters 50 and 60.

The alignment cycle utilizes statistics on characteristics of the alignment signal to compensate for errors. Offset error compensation circuitry utilizes statistics concerned with the duty cycle of each of the digital output bits which are produced when A/D converter 10 (see FIG. 1) converts the alignment signal. Thus, the present invention assumes that each digital output bit should exhibit a 50% duty cycle when all offset errors within A/D converter 10 have been compensated.

Each of stages 22x, 22y, and 22z operate in a similar manner. Accordingly, offset duty cycle counter 50 is initially pre-set with a predetermined value that represents the duty cycle of the digital output bit which is expected during a sample set. For example, since the preferred embodiment utilizes a sample set of 1,024 samples, a digital value equivalent to $-512$ is preset into counter 50 prior to initiation of a sample set. Although FIG. 3 does not show input signals or connections for presetting counter 50, a configuration of counters to accomplish such presetting is well-known to those skilled in the art. Accordingly, the digital output bit which enables counter 50 exhibits one logical state 50% of the time and the other logical state 50% of the time when offset errors have been compensated. Counter 50 should increment for 50% of the samples in a sample set. As a result, the final value achieved by counter 50 should equal 0 at the end of a sample set. In other words, counter 50 is utilized to indicate the duty cycle of the digital output bits.

Comparator 52 tests whether the duty cycle of the digital output bits equals a predetermined value. In the preferred embodiment counter 50 should conclude with a value of 0 at the end of a sample set. Accordingly, comparator 52 compares the output of counter 50 with the value of 0. If, due to offset errors, the duty cycle of the digital output bit does not equal 50%, then one of the greater-than or less-than outputs of comparator 52 will become active. Such activation will cause up/down counter 54 to either increment or decrement at the conclusion of the sample set. Thus, the count output from up/down counter 54 changes when the duty cycle does not equal the predetermined duty cycle, which is 50% in the preferred embodiment.

This change causes a corresponding change in the analog signal output from D/A converter 56. The analog signal output from D/A converter 56 nominaiy equals 0, but may exhibit small positive or negative values to compensate for offset errors. Thus, small positive or negative values may be added to the stage input signal presented at terminal 20 and adder 44.

A negative feedback loop results because the stage input signal is adjusted in adder 44 in such a manner that will cause the duty cycle of the digital output bit to either increase or decrease until the desired duty cycle is achieved. Accordingly, after a sample set occurs, additional sample sets may be sequentially repeated until a predetermined worst case number of sets have been executed so that offset errors for the stage are aligned. Alternatively sample sets may be repeated until the outputs from comparator 52 indicate that the desired duty cycle has been achieved.

Gain error compensation occurs in a manner similar to that described above for offset error compensation. However, the compensation for gain errors does not measure duty cycle of the digital output bit. Rather, the gain error compensation circuitry measures a predetermined logical relationship between a digital output bit and an adjacent lesser significant digital output bit. Since the gain error describes an error which may occur in amplifiers 32, the gain error affects only subsequent stages in the signal flow path and does not effect the digital output bit for the stage in which it occurs. In other words, the gain error caused by amplifier 32x affects only stages 22y and 22z. Consequently, stage 22z would not require compensation for a gain error if stage 22z represented the least signicant stage of A/D converter 10 (see FIG. 1).

Figure 4:
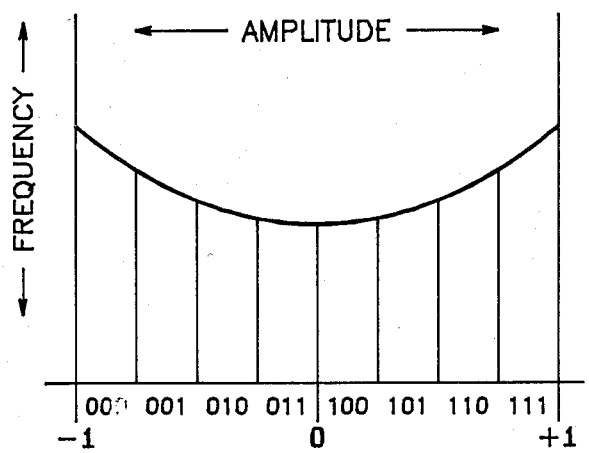
FIG. 4 shows a graph of frequency distribution versus amplitude of a sine wave.

In the preferred embodiment the predetermined logical relationship between adjacent digital output bits is the equivalence of adjacent digital output bits. FIG. 4 shows general frequency distribution versus amplitude for any sine wave. In FIG. 4 the sine wave is normalized to exhibit peak values of $+1$ and $-1$, and the total area under the curve equals 1. The horizontal axis of FIG. 4 is divided into 8 equal sections encoded using a three bit offset binary code. Accordingly, most negative amplitudes of the sine wave are encoded to exhibit a value of 0 (000), most positive amplitudes of the sine wave are encoded to exhibit a value of 7 (111), and an amplitude of 0 occurs at the boundary between 3 (011) and 4 (100). As can be observed from FIG. 4, a sine wave exhibits an amplitude near −1 and near +1 more frequently than it exhibits an amplitude near 0. Furthermore, the probabilty that a sine wave will exhibit a particular digital code, or predetermined logical relationship between digital codes, may be computed by adding the area under the curve for the respective digital codes. For example, the probability that adjacent most significant and middle significant bits of the code shown in FIG. 4 are equal may be obtained by adding the area under the curve in sections 0 (000) 1 (001) 6 (110) and 7 (111) together.

Referring to the preferred embodiment in which a sample set consists of 1,024 samples and A/D converter 10 contains 8 stages, the probabilities that a digital output bit and an adjacent lesser significant digital output bit will exhibit equivalent values are as shown below as an expected number of occurrences.

| Stage | Expected Number of Occurrences |
|---|---|
| a (MSB) | 667 |
| b | 621 |
| c | 587 |
| d | 562 |
| e | 544 |
| f | 531 |
| g (LSB) | 522 |

Referring to FIG. 3, counters 60 are preset with a value corresponding to the negative of the value shown in the table above, depending upon the stage for which a gain error is to be compensated. During the sample set in an alignment cycle, counters 60 will increment only when the predetermined logical relationship, such as the Exclusive OR relationship used in the preferred embodiment, occurs. For stage "a" counter 60 increments 667 times during the 1,024 samples of a sample set when gain errors have been compensated. Since counter 60x was preset with a negative 667 prior to initiation of a sample set, it should achieve a final value of 0 at termination of the sample set. Comparator 62 tests to see whether this final value was achieved, and at the end of the sample set, up/down counter 64 either increments or decrements when a greater or lesser number of occurrences is detected. This incrementing or decrementing of counter 64 causes a change in the count output value from counter 64, which causes a change in the analog signal output from D/A converter 66. This analog output signal is added to the maximum voltage reference signal in adder 68. Accordingly, the maximum voltage reference signal is adjusted in adder 68 to compensate for the gain error. Furthermore, this adjustment operates to form a negative feedback loop which causes the number of occurrences of the predetermined logical relationship detected by Exclusive OR gate 46 to either increase or decrease until the desired number of occurrences are detected in a future sample set. As with the offset error compensation, sample sets are repeated until the gain error has been compensated.

The reference voltage signals applied at terminals 28a through 28e are multiplied by the digital value input to D/A converters 56 and 66 to produce the analog signals output from D/A converters 56 and 66. Accordingly, both the magnitude of the reference signals applied at terminals 28 and the precision of D/A converters 56 and 66 may be adjusted to permit the present invention to successfully operate.

Such adjustment tends to distribute the errors throughout stages 22 of A/D 10 (see FIG. 1). The preferred embodiment allows the error to linearly increase as the stage output signals progress from most significant to least significant stages. Accordingly, the reference voltage signals applied at terminals 28 (see FIG. 3) linearly increase in value as applied from most significant to least significant stages. Such linear increase permits the number of bits of precision of up/down counters 54 and 64 and D/A converters 56 and 66 to remain constant throughout stages 22. And, the constant bit precision enhances expandability of A/D 10 because identical circuitry may be used for any stage of A/D 10. The precise magnitudes of reference signals and precisions may be calculated by those skilled in the art, once the tolerances and accuracies of the amplifiers, comparators, and adders which are used in A/D converter 10 (see FIG. 1) are known.

The alignment cycle of the present invention may proceed to align offset and gain errors utilizing a variety of different procedures. In the preferred embodiment, offset errors for the most significant stage are compensated first. Then, gain errors in the most significant stage are compensated. This procedure is then repeated for the adjacent lesser significant stage, and so on, until the offset error in the least significant stage has been compensated. As discussed above, no need exists for compensating the gain error in the least significant stage.

After errors in the least significant stage have been compensated, the alignment cycle ends. The alignment cycle control signal applied at terminal 18 goes inactive, causing clock generator 70 to stop producing sample clock pulses. Resultingly, the values output from up/down counters 54 and 64 remain unchanged until another alignment cycle is initiated.

The present invention is described above with reference to particular embodiments to facilitate teaching the invention. Those skilled in the art will recognize that many alternative embodiments also fall within the scope of the present invention. For example, the counters, comparators, and D/A converters described above represent conventional components that may be selected and configured to operate substantially as described herein for specific applications. Additionally, those skilled in the art will recognize that the present invention contemplates any number of stages. These and other changes and modifications to the above-described preferred embodiments which are obvious to those skilled in the art are intended to be included within the scope of the present invention.

I claim:

1. An analog-to-digital converter comprising:
    an amplifier having an input adapted to receive a stage input signal and an output for providing an amplifier output signal;
    a comparator having an input coupled to the input of said amplifier and an output for providing a digital output bit; and
    means, coupled to said amplifier output, said comparator output, and a terminal adapted to receive a maximum voltage reference signal, for combining the maximum voltage reference signal with the amplifier output signal under control of the digital output bit, said combining means having an output for providing a stage output signal.

2. An analog-to-digital converter as claimed in claim 1 wherein said combining means comprises:
an adder having a plus input coupled to the output of said amplifier and a minus input;
a multiplier having a first input coupled to the output of said comparator, a second input coupled to the terminal adapted to receive the maximum voltage reference signal, and an output coupled to the minus input of said adder.

3. An analog-to-digital converter as claimed in claim 1 wherein said amplifier is configured to have a gain approximately equal to 2.

4. An analog-to-digital converter as claimed in claim 1 additionally comprising:
a second amplifier having an input coupled to said combining means output and an output for providing a second amplifier output signal;
a second comparator having an input coupled to the input of said second amplifier and an output for providing a second digital output bit; and
second means, coupled to said second amplifier output, said second comparator output, and the terminal adapted to receive the maximum voltage reference signal, for combining the maximum voltage reference signal with the second amplifier output signal under control of the second digital output bit, said combining means providing a second stage output signal.

5. An analog-to-digital converter as claimed in claim 4 additionally comprising:
a third amplifier having an input coupled to said second combining means output and an output for providing a third amplifier output signal;
a third comparator having an input coupled to the input of said third amplifier and an output for providing a third digital output bit; and
third means, coupled to said third amplifier output, said third comparator output, and the terminal adapted to receive the maximum voltage reference signal, for combining the maximum voltage reference signal with the third amplifier output signal under control of by the third digital output bit, said combining means providing a third stage output signal.

6. An analog-to-digital converter as claimed in claim 4 wherein said amplifier and said second amplifier are each configured to have a gain approximately equal to 2.

7. An analog-to-digital converter as claimed in claim 6 wherein a difference in the gain of said amplifier from a gain of 2 represents a gain error, and the analog-to-digital converter additionally comprises means, coupled to said combining means, for adjusting the maximum voltage reference signal to compensate for gain errors of said amplifier.

8. An analog-to-digital converter as claimed in claim 7 wherein the amplifier input is additionally adapted to receive an alignment signal having predetermined characteristics and said adjusting means comprises:
means, coupled to said comparator output and said second comparator output, for indicating the existence of a first predetermined logical relationship between the digital output bit and the second digital output bit;
means, coupled to said indicating means, for testing whether occurrences of the first predetermined logical relationship are greater in number than a second predetermined number for a third predetermined number of samples of the alignment signal; and
means, coupled to said testing means, for changing the maximum voltage reference signal when said testing means indicates that the number of occurrences of the first predetermined logical relationship is greater than the second predeteremined number.

9. An analog-to-digital converter as claimed in claim 4 wherein said comparator produces an offset error and the converter additionally comprises means, coupled to said amplifier, for adjusting the stage input signal to compensate for the offset error.

10. An analog-to-digital converter as claimed in claim 9 wherein said adjusting means is adapted to receive an alignment signal and said adjusting means comprises:
means, coupled to said comparator output for indicating the duty cycle of the digital output bit;
means, coupled to said indicating means, for testing whether the duty cycle is greater than a predetermined duty cycle for a predetermined number of samples of the alignment signal; and
means, coupled to said testing means, for changing the stage input signal when said testing means indicates that the duty cycle of the digital output bit is greater than the predetermined duty cycle.

11. A method of converting an analog signal into a digital representation of the analog signal, said method comprising the steps of:
amplifing the analog signal to produce an amplified analog signal;
comparing the analog signal with a predetermined reference level to produce a digital output bit; and
combining a maximum voltage reference signal with the amplified analog signal in a manner defined by the digital output bit to produce a stage output signal.

12. A method of converting an analog signal as claimed in claim 11 wherein said combining step comprises the steps of:
adding the maximum voltage reference signal to the amplified analog signal when the digital output bit exhibits a first logical state; and
subtracting the maximum voltage reference signal from the amplified anaolg signal when the digital output bit exhibits a second logical state.

13. A method of converting an analog signal as claimed in claim 11 additionally comprising the steps of:
amplifing the stage output signal to produce a second amplified analog signal;
comparing the stage output signal with the predetermined reference level to produce a second digital output bit; and
combining the maximum voltage reference signal with the second amplified analog signal in a manner defined by the second digital output bit to produce a second stage output signal.

14. A method of converting an analog signal as claimed in claim 13 additionally comprising the steps of:
amplifing the second stage output signal to produce a third amplified analog signal;

comparing the second stage output signal with the predetermined reference level to produce a third digital output bit; and combining the maximum voltage reference signal with the third amplified analog signal in a manner defined by the third digital output bit to produce a third stage output signal.

15. A method of converting an analog signal as claimed in claim 13 wherein:

said amplifying the analog signal step amplifies the analog signal by a factor of approximately 2; and said amplifying the stage output signal step amplifies the stage output signal by a factor of approximately 2.

16. A method of converting an analog signal as claimed in claim 15 wherein:

said amplifying step produces a gain error; and said combining step comprises the step of adjusting the maximum voltage reference signal to compensate for the gain error.

17. A method as claimed in claim 16 wherein said adjusting step comprises the steps of:

forcing the analog signal to be an alignment signal having predetermined characteristics;

indicating the existence of a predetermined logical relationship between the digital output bit and the second digital output bit;

testing whether a number of occurrences of the predetermined logical relationship are greater than a second predetermined number for a third predetermined number of samples of the analog signal; and changing the maximum voltage reference signal when said testing step indicates that the number of occurrences of the predetermined logical relationship is greater than the second predetermined number.

18. A method of converting an analog signal as claimed in claim 13 wherein said comparing step produces an offset error and the method additionally comprises the step of adjusting the analog signal to compensate for the offset error.

19. An analog-to-digital converter comprising:

a first amplifier configured to have a gain of approximately 2 and having an input adapted to receive an analog input signal and an output for providing a first amplifier output signal;

a first comparator having an input coupled to the input of said first amplifier and an output for providing a first digital output bit;

first means, coupled to said first amplifier output, said first comparator output, and a terminal adapted to receive a maximum voltage reference signal, for combining the maximum voltage reference signal with the first amplifier output signal under control of the first digital output bit, said combining means having an output for providing a first stage output signal;

a second amplifier configured to have a gain of approximately 2 and having an input coupled to said first combining means output and an output for providing a second amplifier output signal;

a second comparator having an input coupled to the input of said second amplifier and an output for providing a second digital output bit;

second means, coupled to said second amplifier output, said second comparator output, and the terminal adapted to receive the maximum voltage reference signal, for combining the maximum voltage reference signal with the second amplifier output signal under control of the second digital output bit, said combining means providing a second stage output signal;

means, coupled to said first comparator output, said second comparator output, and said first combining means for adjusting the maximum voltage reference signal to compensate for gain errors of said first amplifier; and means, coupled to said first comparator output, the input of said first comparator, and the input of said first amplifier, for adjusting the analog input signal to compensate for offset errors of said first comparator.

* * * * *